United States Patent [19]

Sugiyama et al.

[11] Patent Number: 4,841,177
[45] Date of Patent: Jun. 20, 1989

[54] COMPARATOR CIRCUIT OPERABLE FOR A WIDE RANGE OF INPUT SIGNAL

[75] Inventors: Takahiro Sugiyama; Mitsutoshi Sugawara, both of Tokyo, Japan

[73] Assignee: NEC Corporation, Tokyo, Japan

[21] Appl. No.: 141,873

[22] Filed: Jan. 6, 1988

[30] Foreign Application Priority Data

Jan. 7, 1987 [JP] Japan ................................ 62-2213

[51] Int. Cl.$^4$ .......................... G06G 7/12; H03K 5/00; H03K 5/22; H03K 5/153
[52] U.S. Cl. ..................................... 307/494; 307/497; 307/477; 307/542; 307/544; 307/362; 328/115; 328/146
[58] Field of Search ............... 307/490, 491, 494, 497, 307/499, 356, 358, 360, 363, 268, 542, 544, 545, 547, 362; 328/115, 146

[56] References Cited

U.S. PATENT DOCUMENTS

| 3,573,638 | 4/1971 | Cox, Jr. ........................ 307/360 |
| 3,894,288 | 7/1975 | Musser, Jr. .................... 328/115 |
| 4,020,423 | 4/1977 | Guyot et al. ................... 307/362 |
| 4,549,099 | 10/1985 | Yamada et al. ................ 307/503 |
| 4,652,774 | 3/1987 | Hasegawa ....................... 307/360 |
| 4,672,238 | 6/1987 | Nemoto ......................... 307/358 |

Primary Examiner—John S. Heyman
Assistant Examiner—Trong Quang Phan
Attorney, Agent, or Firm—Helfgott & Karas

[57] ABSTRACT

An improved comparator circuit which can operate stably against noise or fluctuation in a power supply is disclosed. The comparator circuit includes a differential amplifier having first and second input terminal, a first diode for biasing the first input terminal at a constant voltage, a second diode coupled between the first and second input terminals, and means for gradually changing the potential at the first input terminal towards the above constant voltage.

9 Claims, 4 Drawing Sheets

U.S. Patent    Jun. 20, 1989    Sheet 1 of 4    4,841,177
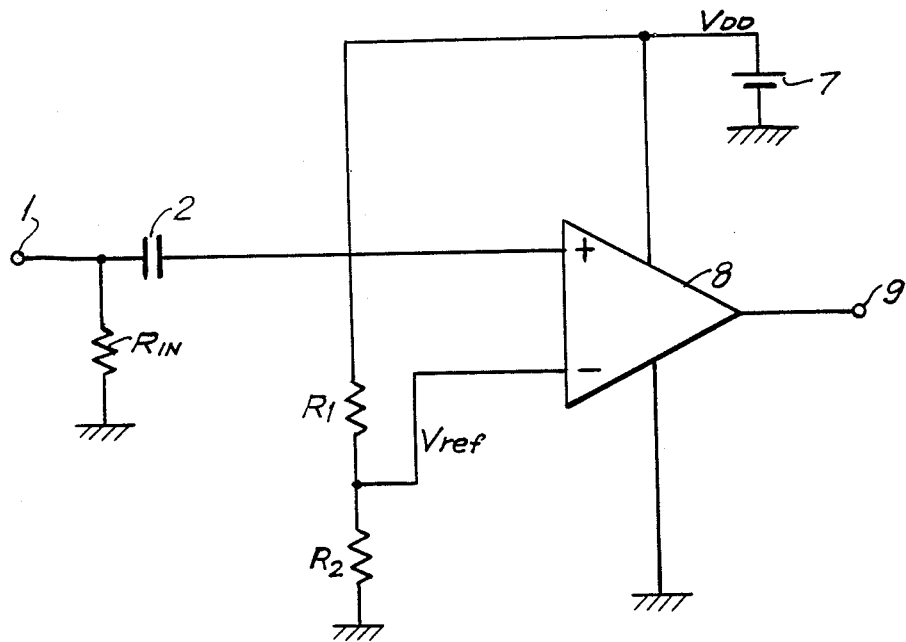
PRIOR ART
FIG. 1
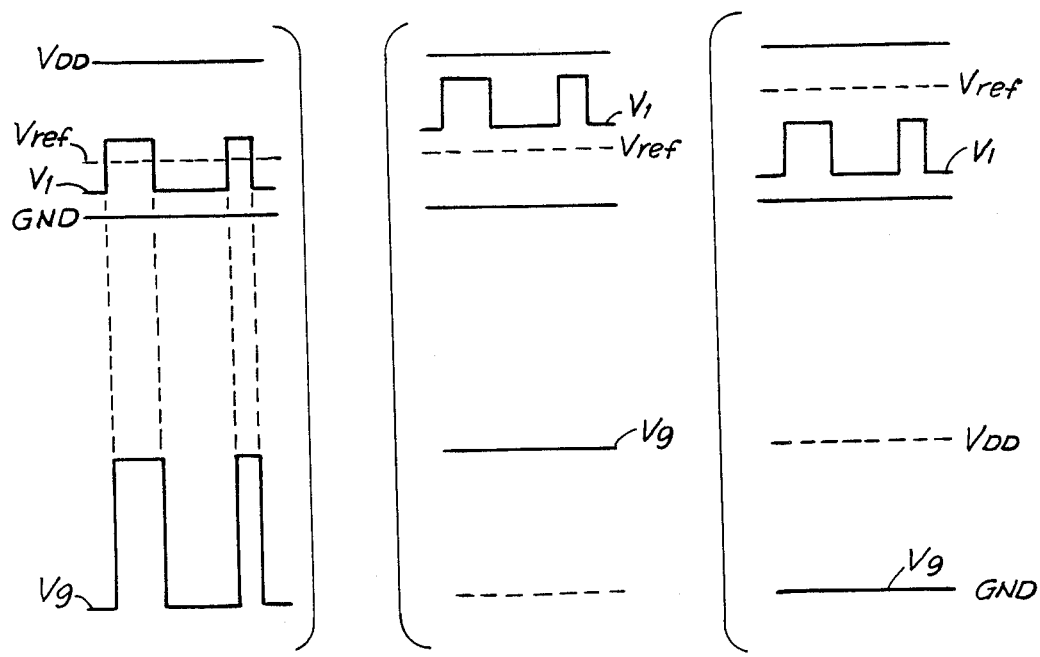
PRIOR ART
FIG. 2A
PRIOR ART
FIG. 2C
PRIOR ART
FIG. 2C

COMPARATOR CIRCUIT OPERABLE FOR A WIDE RANGE OF INPUT SIGNAL

BACKGROUND OF THE INVENTION

The present invention relates to a comparator circuit for comparing an input signal with a reference voltage.

A comparator circuit basically comprises a differential amplifier provided with a pair of input terminals (a non-inverting input terminal and an inverting input terminal) and an output terminal.

An input signal and a reference voltage are applied to the pair of input terminals, respectively and the differential amplifier compares the input signal with the reference voltage. As is well known in the art, the reference voltage is set at approximately center of high and low levels of the input signal, and the differential amplifier produces a first level (e.g. a power voltage $V_{DD}$) of output when the input signal is larger or higher than the reference voltage and a second level (e.g. a ground potential) of output when the input signal is smaller or lower than the reference voltage thereby to achieve the comparison of the input signal and the reference voltage.

The above-mentioned comparator circuit operates accurately as far as the reference voltage is at the approximately center of the high and low levels of the input signal. However, in the case where the input signal is shifted in level due to noise or the like and both of the high and low levels of the input signal are higher or lower than the reference voltage, the differential amplifier always produces a first or a second level of output irrespective of the state of the input signal, resulting in failure in the comparison between the input signal and the reference voltage. Also in the case where the reference voltage is shifted above the high level of the input signal or lower the low level of the input signal due to fluctuation of the power voltage, the differential amplifier fails to achieve the comparison between the input signal and the reference voltage.

SUMMARY OF THE INVENTION

It is an object of the present invention to provide a comparator circuit operable for a wide range of input signal.

It is another object of the present invention to provide an improved comparator circuit operable without being influenced by noise or fluctuation of a power voltage.

The comparator circuit according to the present invention comprises a signal input terminal, a differential amplifier having first and second input terminals and an output terminal, a capacitor coupled between the signal input terminal and the first input terminal, a first diode coupled between the second input terminal and a first voltage terminal, a second diode coupled between the first and second input terminals, and means coupled to the first input terminal for gradually changing the potential at the first input terminal towards the potential at the second input terminal.

According to the present invention, the second input terminal of the differential amplifier is set at a constant voltage determined by the first voltage and the potential at the first input terminal of the differential amplifier is clamped by the second diode and swung with respect to the potential at the second input terminal.

Therefore, the comparative relation between the potentials at the first and second input terminals of the differential amplifier can be laid in a desired state. Thus, stable comparison operation can be achieved without influence of noise or fluctuation in a power voltage.

BRIEF DESCRIPTION OF THE DRAWINGS

FIG. 1 is a schematic block diagram of a comparator circuit according to a prior art;

FIGS. 2A, 2B and 2C are timing diagrams showing operations of the comparator circuit of FIG. 1;

DETAILED DESCRIPTION OF THE INVENTION

Figure 3:
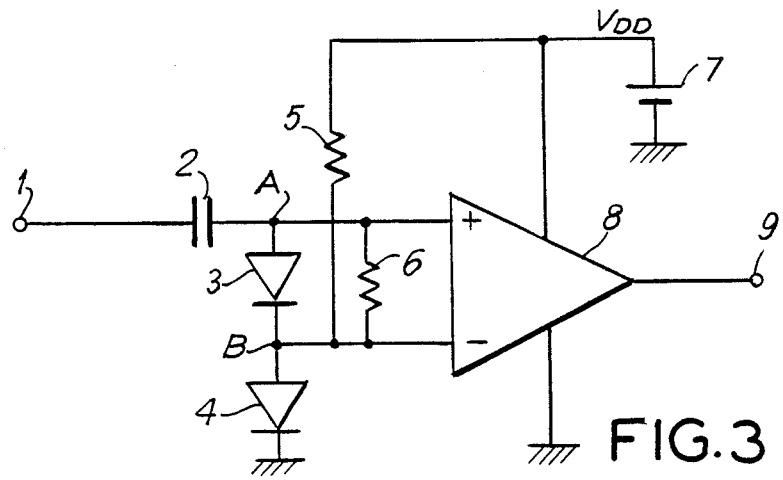
FIG. 3 is a schematic block diagram showing a comparator circuit according to a first embodiment of the present invention.

Referring to FIGS. 1 and 2, a conventional comparator circuit and its operation are explained.

As shown in FIG. 1, the comparator circuit basically comprises a differential amplifier 8 supplied with a power voltage $V_{DD}$ from a power source 7 and a ground potential (GND) as power supply. An input terminal 1 is connected to a non-inverting input terminal (+) of the differential amplifier 8 via a capacitor 2. A pull-down resistor $R_{IN}$ is connected between the input terminal 1 and the ground potential. Resistors R1 and R2 coupled between the power voltage $V_{DD}$ and the ground potential form a voltage divider to generate a reference voltage $V_{ref}$ from the intermediate junction of the resistors R1 and R2. The reference voltage is applied to an inverting input terminal (−) of the differential amplifier 8. A comparison result is outputted from an output terminal 9.

FIG. 2A shows a normal comparison operation of the comparator circuit of FIG. 1. The reference voltage $V_{ref}$ is at approximately center of high and low level of the input signal $V_1$ applied at the input terminal 1. When the level of the input signal $V_1$ is above the reference voltage $V_{ref}$, the differential amplifier produces a high level of output $V_9$. When the input signal $V_1$ below $V_{ref}$, a low level of output signal $V_9$ is produced.

FIG. 2B shows the case where the low level of the input signal $V_1$ is shifted above $V_{ref}$ due to noise or the like superposed on the input signal $V_1$. In this case, the differential amplifier 8 always produces a high level of the output $V_9$ irrespective of the state of the input signal $V_1$. Thus, the comparison between the input signal $V_1$ and the reference voltage $V_{ref}$ cannot be achieved.

FIG. 2C shows the case where the reference voltage $V_{ref}$ is shifted above the high level of the input signal $V_1$ due to fluctuation in the power voltage $V_{DD}$ or the like. In this case, the input signal $V_1$ is always below $V_{ref}$ and therefore, high and low levels of the input signal $V_1$ cannot be distinguished by the output $V_9$ of the amplifier 8.

Referring to FIG. 3, a comparator circuit according to a first embodiment of the invention is explained.

In FIG. 3, elements corresponding to those shown in FIG. 1 are denoted by the same references.

The present embodiment is featured by a diode 3 having an anode connected to a node A, i.e. the non-inverting input terminal (+) of the amplifier 8 and a cathode connected to a node B, i.e. the inverting input terminal (−) of the amplifier 8, a diode 4 having an anode connected to the node B and a cathode connected to the ground, a resistor 6 connected in parallel with the diode 3, and a resistor 5 connected between the power voltage $V_{DD}$ and the node B.

Figure 4:
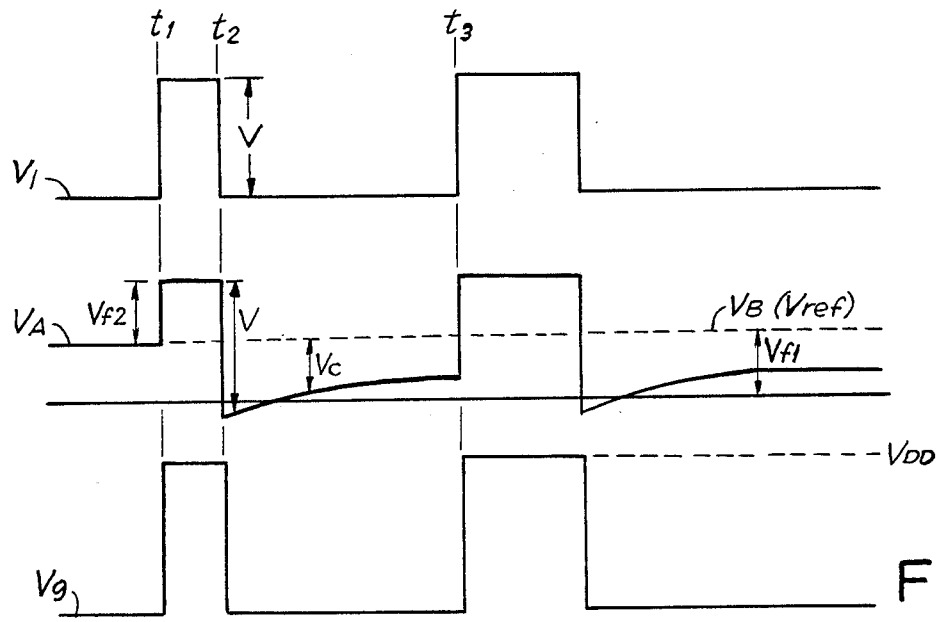
FIG. 4 is a timing diagram showing operation of the comparator circuit of FIG. 3.

Referring to FIG. 4, operation of the circuit of FIG. 3 is explained.

The potential $V_B$ serving as the reference voltage $V_{ref}$ at the node B is determined by a forward voltage $V_{f1}$ of the diode 4 which passes a current from $V_{DD}$ via the resistor 5 to the ground. Thus, the potential $V_B$ is set at $V_{f1}$ with respect to the ground potential.

When the signal $V_1$ at the input terminal 1 is raised in potential by an amplitude V at a time $t_1$, this rise in potential $V_1$ is transmitted to the node A through the capacitor 2 so that the potential $V_A$ at the node A is raised by a forward voltage $V_{f2}$ of the diode 3 from $V_B$ so that the potential $V_A$ becomes a high voltage ($V_{f1}+V_{f2}$) with resect to the ground. In this instance, the potential $V_A$ applied to the non-inverting input terminal (+) is higher than the potential $V_B$ applied to the inverting input terminal (−), and therefore the output $V_9$ at the output terminal 9 changes from the ground potential to $V_{DD}$. This shows that the high level of the input signal $V_1$ is applied to the comparator.

When the input signal $V_1$ falls from the high level to the low level at a time $t_2$, the potential $V_A$ at the node A rapidly falls in potential by the amplitude V from the level of ($V_{f1}+V_{f2}$) through the capacitor 2. However, immediately after the potential fall of $V_A$, the potential $V_A$ is raised gradually according to a time constant determined by the capacitor 2 and the resistor 6 towards the potential $V_B$ until a time $t_3$ when the input signal $V_1$ is again raised in potential. In this instance, the potential $V_A$ applied to the non-inverting input (+) of the amplifier 8 is below the potential $V_B$ applied to the inverting input terminal (−) of the amplifier 8 so that a low level output $V_9$ is produced. During the period from $t_2$ to $t_3$, if some noise is applied to the input terminal 1, the output $V_9$ is not affected by the noise unless the potential of the noise exceeds the sum of the forward voltage $V_{f1}$ and a potential difference $V_C$ illustrated, i.e. $V_{f1}+V_C$. The operation after $t_3$ is performed similarly.

Figure 9:
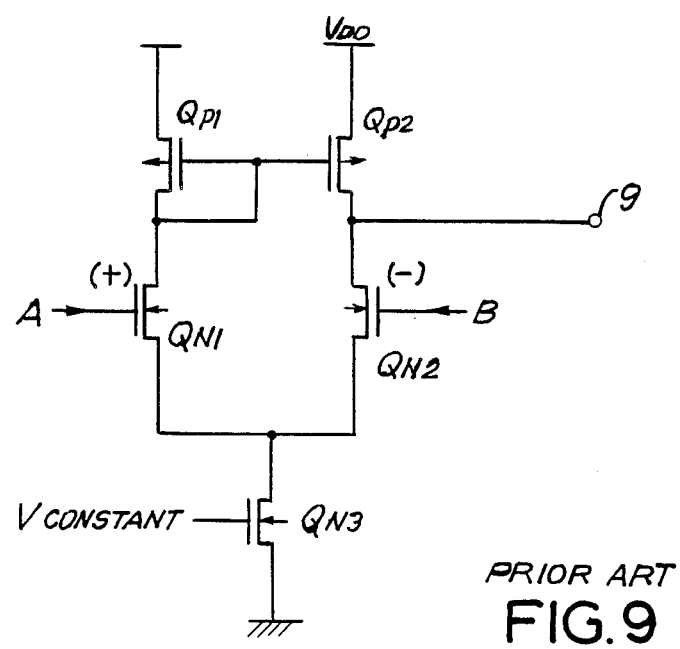
FIG. 9 is a schematic circuit diagram showing an example of the differential amplifier.

In the embodiment, any known differential amplifier can be employed as the amplifier 8. One example is illustrated in FIG. 9. As shown in FIG. 9, the amplifier 8 is composed of P-channel transistors $Q_{P1}$ and $Q_{P2}$ forming a current mirror type load circuit, N-channel input transistors $Q_{N1}$ and $Q_{N2}$ and an N-channel constant current transistor $Q_{N3}$.

Figure 5:
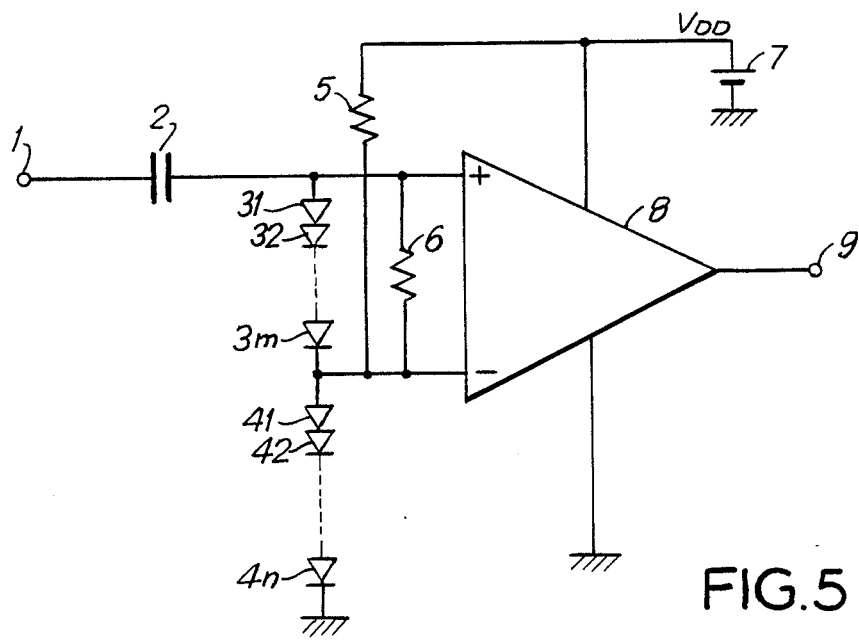
FIG. 5 is a schematic block diagram of a comparator circuit according to a second embodiment of the present invention.

Referring to FIG. 5, a comparator circuit according to a second embodiment is explained.

The circuit of the present invention is obtained by replacing the diodes 3 and 4 in FIG. 3 with a series connection of diodes 3l-3n and a series connection of diodes 4l-4n, respectively. By adjusting the numbers m and n, $V_{f1}$ and $V_{f2}$ in FIG. 4 can be set at optional values.

Figure 6:
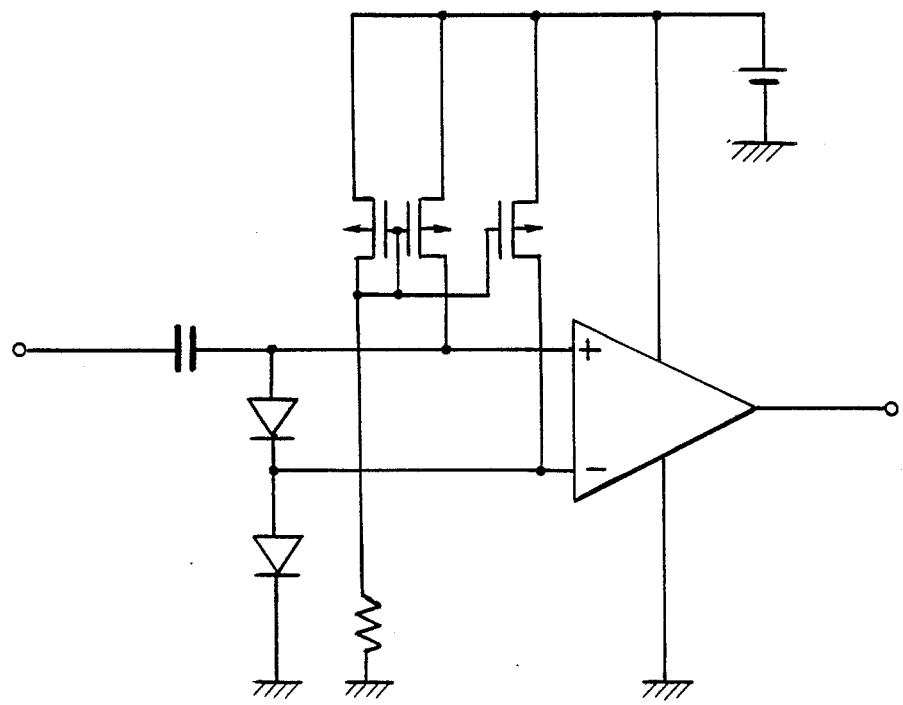
FIG. 6 is a schematic block diagram showing a comparator circuit according to a third embodiment of the present invention.

Referring to FIG. 6, a comparator circuit according to a third embodiment of the present invention is explained.

This embodiment is obtained by P channel MOS field effect transistors 11 to 13 and a resistor 14 in place of the resistors 5 and 6 of FIG. 3. The transistors 11 to 13 and the resistor 14 form a known current mirror circuit and the transistors 12 and 13 provide constant values of currents to the nodes A and B, respectively. The current from the transistor 13 makes the diode 4 conductive to set the potential $V_B$ at the forward voltage $V_{f1}$ with respect to GND.

The transistor 12 has the smaller dimension than that of the transistor 13 to flow the smaller amount of current to the node A. this current from the transistor 12 is used to charge the capacitor 2.

The operation of this embodiment is similar to that of the circuit of FIG. 3. Only difference is that the curve of $V_A$ from $t_2$ to $t_3$ in FIG. 4 is not exponential but linear. This embodiment is advantageous in forming the comparator circuit at high density because the transistors 11 to 13 can be formed by a small area on a semiconductor substrate as compared to the formation of the resistors 5 and 6.

Figure 7:
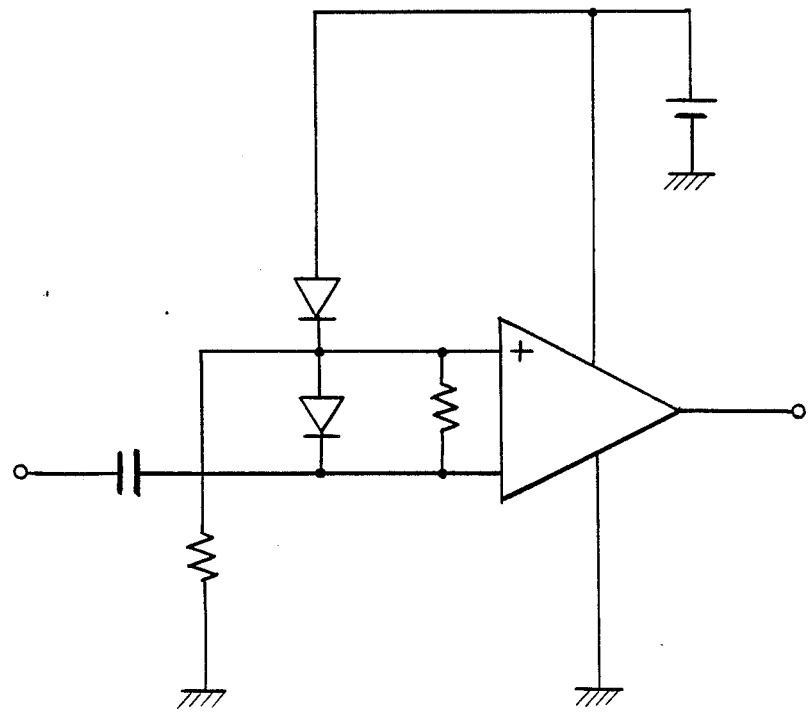
FIG. 7 is a schematic block diagram of a comparator circuit according to a fourth embodiment.

FIG. 7 shows a fourth embodiment of the present invention.

This embodiment corresponds to the case where the polarity of the power voltage and the inputs of the amplifier 8 in FIG. 3 is reversed.

Namely, the input terminal 1 is coupled to the inverting input (−) of the amplifier 8 through the capacitor 2. A diode 4' is connected between the power voltage $V_{DD}$ to a node A' connected to the non-inverting input (+) and a resistor 5' is coupled between the node A' and the ground potential to make the diode 4' conductive. Therefore, the node A' is biased at the potential "$V_{DD}-V_{f1}$" ($V_{f1}$ being the forward voltage of the diode 4'). A diode 3' is coupled between the nodes A' and B' to clamp the lower level at the node B' to the potential "$V_{DD}-V_{f1}-V_{f2}$" ($V_{f2}$ being a forward voltage of the diode 3').

Figure 8:
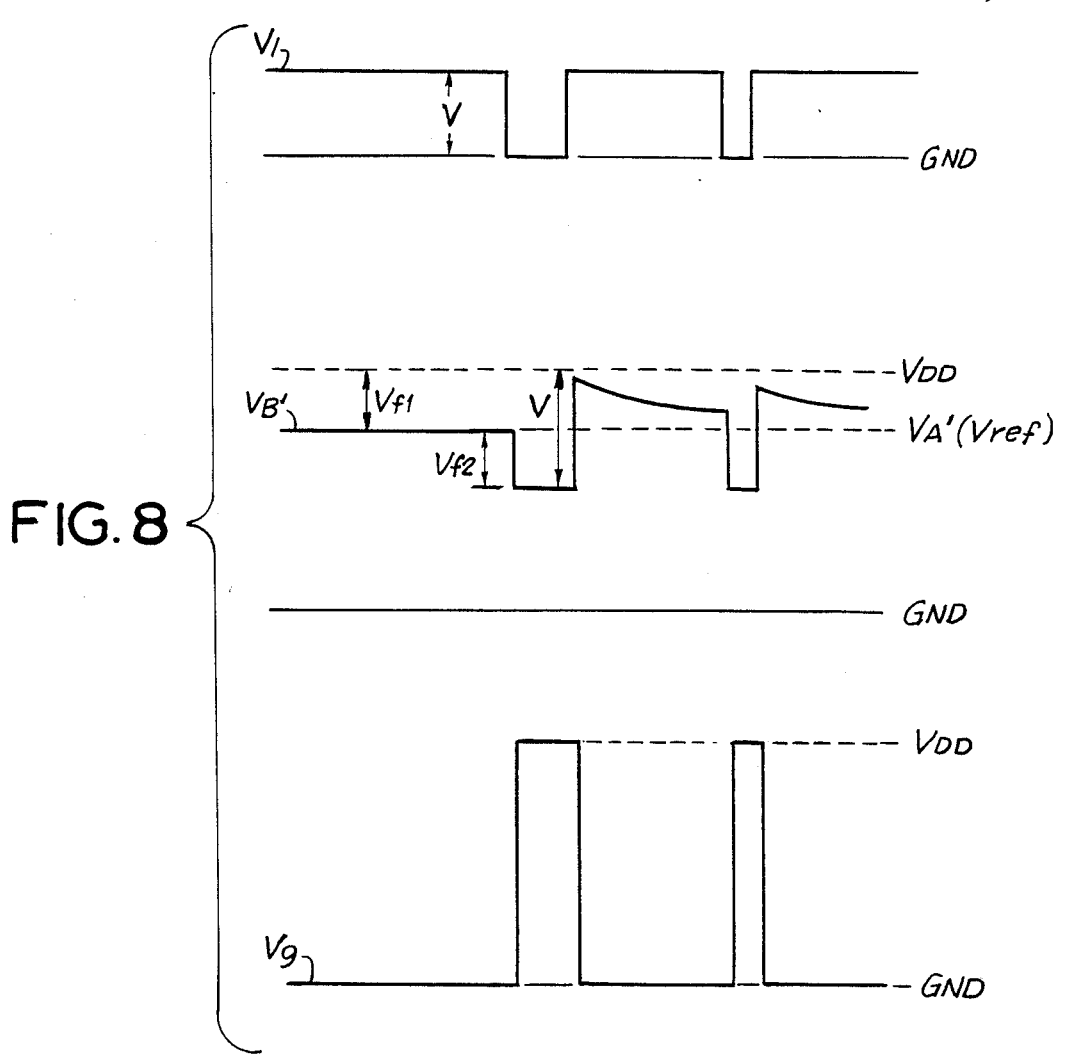
FIG. 8 is a timing diagram showing operation of the circuit of FIG. 7.

Thus, the comparator circuit according to this embodiment detects the fall of the input signal $V_1$ at the input terminal and generates a high ($V_{DD}$) level of output $V_9$ at the output terminal 9 upon the fall of $V_1$, as illustrated in FIG. 8.

As has been explained above, the comparator circuit according to the present invention can operate without influence of noise or fluctuation in a power voltage.

We claim:

1. A comparator circuit comprising a signal input terminal receiving an input signal, a signal output terminal, first and second voltage terminals, a differential amplifier having first and second input nodes and an output node, said output node having no ohmic electrical connection with said first and second input nodes, a capacitor coupled between said signal input terminal and said first input node, a first diode coupled between said second input node and said second voltage terminal in a forward direction thereof from said second input node to said second voltage terminal, first means coupled only between said second input node and said first voltage terminal without connection to said output node for biasing said first diode to make said first diode conductive in a forward-biased state, a second diode coupled between said first and second input nodes to clamp a voltage difference between said first and second input nodes to a predetermined value, second means coupled to at least said first input node for gradually equalizing the potential at first input node to the potential at said second input node with a predetermined time constant irrespective of a level of said output node, said time constant being greater than an interval period between two succeeding occurrences of said input signal, and a lead means for coupling said output node to said signal output terminal, whereby a voltage difference is provided between said first input node and said second input node during said interval period.

2. The circuit according to claim 1, in which said first means includes a first resistor coupled between said first voltage terminal and said second input node.

3. The circuit according to claim 1, in which said second means includes a second resistor coupled between said first and second input nodes.

4. The circuit according to claim 1, in which said first means includes a first transistor having a current path coupled between said second input node and said first voltage terminal.

5. The circuit according to claim 1, in which said second means includes a second transistor having a current path coupled between said first input node and said first voltage terminal.

6. A comparator circuit comprising a signal input terminal, first and second voltage terminals, a differential amplifier having first and second input nodes and an output node, said output node having no ohmic connection to said first and second input nodes, a signal output terminal, a capacitor coupled between said signal input terminal and said first input node, at least one first diode connected between said second input node and said second voltage terminal in a forward direction thereof from said second input diode to said second voltage terminal, at least one second diode coupled between said first and second input nodes, a first resistor coupled between said second input node and said first voltage terminal to thereby make said at least one first diode conductive in a forward-biased state, said second input node being continuously biased at a fixed voltage corresponding to said forward-biased state of said at least one first diode, a second resistor coupled between said first and second input node, said capacitor and said second resistor providing a predetermined time constant between said first input node and said second input node irrespective of a level of said output node when said at least one second diode is non-conductive, and a lead means for coupling said output node to said signal terminal, whereby a difference in a voltage is provided between said first and second input node during a time corresponding to said predetermined time constant.

7. A comparator circuit comprising an input terminal for receiving an input terminal for receiving an input signal; first and second voltage terminals; an output terminal; a differential amplifier having a first input node, a second input node and an output node, a first field effect transistor of a first conductivity type connected between said first voltage terminal and a first node, a second field effect transistor of said first conductivity type connected between said first voltage terminal and said output node, a third field effect transistor of a second conductivity type connected between said first node and a second node, a fourth field effect transistor of said second conductivity type connected between said output node and said second node, a fifth field effect transistor of said second conductivity type interconnected between said second node and said second voltage terminal, means for connecting gates of said first and second field effect transistors to said first node, means for connecting a gate of said third field effect transistor to said first node, means for connecting a gate of said third field effect transistor to said first input node, means for connecting a gate of said fourth field effect transistor to said second input node, and means for continuously rendering said fifth field effect transistor conductive, said output node having no ohmic connection with said first and second input nodes; a capacitor interconnected between said input terminal and said first input node; a first diode connected between said second input node and said second voltage terminal in a forward direction from said second input node to said second voltage terminal; a first resistor connected between said second input node and said first voltage terminal to thereby render said first diode conductive in a forward-biased state; a second diode connected between said first input node and said second input node in a forward direction from said first input node to said second input node; a second resistor interconnected between said first input node and said second input node, said second resistor and said capacitor providing a predetermined time constant between said first input node and said second input node, said predetermined time constant being greater than a repetition period of the input signal; and a lead means for connecting said output node only to said output terminal.

8. A comparator circuit comprising an input terminal for receiving an input signal; first and second voltage terminals; an output terminal; a differential amplifier having a first input node, a second input node, and an output node, said output node having no ohmic connection to said first and second input nodes; a capacitor interconnected between said input terminal and said first input node; a first diode interconnected between said second input node and said second voltage terminal in a forward direction from said second input node to said second voltage terminal; a second diode interconnected between said first input node and said second input node in a forward direction from said first input node to said second input node; a first field effect transistor interconnected between said first voltage terminal and said second input node; a second field effect transistor interconnected between said first voltage terminal and said first input node; a series circuit of a third field effect transistor and a resistor interconnected between said first voltage terminal and second input node; means for connecting gates of said first, second and third field effect transistors to an intermediate junction of said series circuit; and a lead means for connecting said output node only to said output terminal.

9. The circuit according to claim 8, in which said differential amplifier further includes a fourth field effect transistor of a first conductivity type interconnected between said first voltage terminal and a first node, a fifth field effect transistor of said first conductivity type interconnected between said first voltage terminal and said output node, a sixth field effect transistor of a second conductivity type interconnected between said first node and a second node, a seventh field effect transistor of said second conductivity type interconnected between said output node and said second node, an eighth field effect transistor of said second conductivity type interconnected between said second node and said second voltage terminal, and said first, second and third transistors being of said first conductivity type.

* * * * *